United States Patent [19]

Brower et al.

[11] 4,394,710
[45] Jul. 19, 1983

[54] DIE-STAMPED CIRCUIT BOARD ASSEMBLY FOR PHOTOFLASH DEVICES

[75] Inventors: Boyd G. Brower, Williamsport; David R. Broadt, Lewisburg; John W. Shaffer, Williamsport, all of Pa.

[73] Assignee: GTE Products Corporation, Stamford, Conn.

[21] Appl. No.: 336,532

[22] Filed: Jan. 4, 1982

Related U.S. Application Data

[62] Division of Ser. No. 131,711, Mar. 19, 1980, Pat. No. 4,325,771.

[51] Int. Cl.³ .............................................. H05K 3/20
[52] U.S. Cl. .................................... 361/401; 361/404; 156/261
[58] Field of Search ................ 361/401, 404; 431/359; 29/835, 845, 849; 156/261

[56] References Cited

U.S. PATENT DOCUMENTS

| | | | |
|---|---|---|---|
| 2,772,501 | 12/1956 | Malcolm | 156/261 X |
| 3,253,324 | 5/1966 | Frey et al. | 361/401 X |
| 3,543,397 | 12/1970 | Hoagland et al. | 361/401 X |
| 3,823,344 | 7/1974 | Havas | 431/359 X |
| 3,911,716 | 10/1975 | Weglin | 156/261 X |
| 4,017,728 | 4/1977 | Audese et al. | 431/359 X |
| 4,020,798 | 6/1977 | Bechard et al. | 29/849 X |
| 4,030,001 | 6/1977 | Medley et al. | 361/401 |
| 4,113,424 | 9/1978 | Armstrong et al. | 431/359 |

*Primary Examiner*—R. R. Kucia
*Attorney, Agent, or Firm*—Lawrence R. Fraley

[57] ABSTRACT

A circuit board assembly wherein the assembly includes a dielectric substrate, at least one radiation sensitive switch, and at least one conductive member in electrical contact with the switch. Portions of the switch and the conductive member are die-stamped into the dielectric substrate to achieve the contact without severing the switch material.

15 Claims, 5 Drawing Figures

DIE-STAMPED CIRCUIT BOARD ASSEMBLY FOR PHOTOFLASH DEVICES

This is a division of Ser. No. 131,711, filed Mar. 19, 1980, and now U.S. Pat. No. 4,325,711.

TECHNICAL FIELD

The invention relates to electrically-activated, disposable photoflash devices and particularly to the circuit board assemblies utilized therein.

BACKGROUND

Photoflash devices of the variety mentioned above typically include a circuit board having an insulative substrate with preestablished circuit patterns or "runs" thereon. Electrically connected at designated locations to this circuitry are a plurality (e.g., eight or ten) of high voltage flashlamps. The circuit board, with flashlamps secured thereto, is located within a suitable, insulative housing having a light-transmitting cover (to permit the high intensity output from each flashlamp to pass therethrough) and at least one connector tab for attaching the device to a respective camera and electrically connecting the circuit board's circuitry to the power source (e.g., piezoelectric element) typically located therein. Activation of the power source by the camera's user, such as by depressing the shutter release button, results in a firing pulse being provided the circuitry and ignition of one of the device's flashlamps. One type of device containing a pair of opposing linear arrays of flashlamps and a singular, common connector tab is referred to in the art as a "flash bar", while another type, which is capable of being inverted and thus possessing two opposing connector tabs, is referred to as a "flip-flash". The "flip-flash" devices were designed primarily to substantially eliminate the photographic phenomenon known as "red-eye", which occurs when light is reflected by the retinae of subjects' eyes onto the photographic film to indicate the eyes' pupils as being red. These latter devices substantially eliminate this possibility by spacing the illuminating flashlamp a specified distance from the camera's lens.

One example of the aforementioned "flash bar" photoflash device is described in U.S. Pat. No. 3,857,667 (J. J. Vetere et al.). An example of an eight flashlamp arrayed "flip flash" is described in U.S. Pat. No. 4,113,424 (D. E. Armstrong et al.), while examples of ten lamp versions of this product are described in U.S. Pat. Nos. 4,152,751 (R. E. Sindlinger et al.) and 4,164,007 (E. G. Audesse et al.). All of the above patents are assigned to the assignee of the instant invention.

As stated, the present invention is concerned with a circuit board assembly which eventually forms an integral part of the final photoflash product. One example of a known technique for making such components (e.g., those used in the aforedescribed "flash bar" device) has been to silk-screen a silver-containing material over a ceramic-coated steel board and thereafter oven-fire the assembly to fuse the silver particles to a continuous conductor. The steel board was originally blanked from a strip of said material, sprayed or dipped with the ceramic, and fired to produce a hardened coating thereon. Silk-screening and oven-firing followed. Another type of technique (e.g., for those components used in many "flip-flash" devices) also involved silk-screening of silver-containing material but instead on a styrene copolymer, thermoplastic substrate (or board). The silver-containing material, applied in paste form, was then subjected to either a radiation curing or hot air drying step. In both of the above examples, the cured silver-containing material served as the conductive circuit in the finished device. Yet another technique (as used in at least one embodiment of a "flip-flash" device) involved approximately the same procedures as used to manufacture circuit board assemblies in such products as television sets. This process required several steps, including photo-resist coating a copper-clad sheet of phenolic or other suitable base material and thereafter chemically removing (e.g., etching) the undesired copper. This component was then thoroughly cleaned and coated with a protective film.

The aforementioned techniques and resulting products contain several disadvantages. Silk-screening, for example, requires utilization of pastes which in turn are comprised of discrete silver particles located therein and separated by a binder. Although these pastes are eventually subject to some form of heat treatment to hopefully fuse said particles, the finished circuitry understandably is limited in its conductivity (and thus possesses an inherently higher resistance) in comparison to conductors presented in another state. Silk-screened circuitry is also susceptible to containment of discontinuities as might result from dust or lint interference during the screening operation. The presence of a screened silver layer also poses a problem when the chosen method for securing the device's flashlamps to the circuitry is soldering. Occasionally, the silver layer has prevented proper wetting during this process. Still another inherent problem with silk-screening conductive circuitry is the ready opportunity for dimensional impreciseness due to the horizontal flow (beneath the screen) as the paste is forced through the screen's pattern. In addition, occasional smearing of the circuit run is practically unavoidable. The latter problems are particularly troublesome to devices employing high voltage flashlamps in that sparkover can then occur between the circuit's elements, resulting in either product failure or simultaneous flashing of two or more lamps. A final disadvantage of the above processes is the relatively high costs associated therewith. Techniques using photo-resist coating, development, and subsequent chemical removal are understandably costly in terms of both time and material. Silk-screening is also understandably costly, particularly as a result of using the precious metal silver and the relatively rapid wear of the screen materials typically used in this process.

The present invention overcomes the several, aforementioned disadvantages by providing a circuit board assembly wherein the technique of die-stamping is utilized to accurately define and position a conductive circuit on an insulative substrate without the need for photo-resists, chemical echtants, precious metals, etc. In addition to this, and of equal or greater significance, this technique as utilized in the present invention defines a procedure whereby the device's circuit runs (or paths) can be satisfactorily positioned and electrically connected to other elements which also constitute part of the device's circuitry without causing damage thereto. One primary example of such an element as utilized in today's more recent products is a radiation sensitive switch which is usually electrically connected in series with a respective flashlamp and adapted for receiving the radiant energy from the lamp upon ignition thereof. The switch will thus melt or shrink to define an open circuit almost instantaneously after flashlamp ignition and thereby permit reliable flashing of the subsequent lamps in the device's array in rapid succession An example of a radiation sensitive switch is described in U.S. Pat. No. 4,017,728 (E. G. Audesse et al.), which is also assigned to the assignee of the present invention. As described therein, these switches each are typically comprised of a thin strip of polymeric material attached to the circuit board across a respective aperture provided therein. A typical ten-lamp array will include eight switches of this variety in view of the obvious understanding that the last fired lamp on each end of the array has no need for such an element. It is understood that the relatively delicate nature of such elements as radiation sensitive switches does not readily permit electrical connection thereto by a technique as relatively severe and demanding as die-stamping. Die-stamping has been utilized in the production of printed circuit components for use in other types of products than those described above but only because such components (and therefore products) did not require elements such as radiation sensitive switches therein. Typically, these products consisted of only a base or substrate, a solid metal conductor (e.g., copper foil), and a bonding adhesive. See, e.g., U.S. Pat. Nos. 3,911,716 (W. Weglin) and 3,990,142 (W. Weglin). The invention as will be described is thus deemed all the more unique and significant in that it not only assures positive electrical connection between the component's circuit runs and delicate switch elements but also provides for definition and securement of the circuit runs to the insulative substrate which forms an integral part of the final product.

It is believed therefore that circuit board assemblies produced in accordance with the techniques defined herein will constitute significant advancements in the art.

DISCLOSURE OF THE INVENTION

It is therefore a primary object of the present invention to enhance the art of circuit board assemblies for use in electrically activated photoflash products.

In accordance with one aspect of the invention there is provided a circuit board assembly which comprises a dielectric substrate, at least one switching element having a portion thereof pressed within the substrate, and a conductive member also pressed within the substrate. At least part of the conductive member is positioned atop the pressed portion of the switching element and in electrical contact therewith.

BEST MODE FOR CARRYING OUT THE INVENTION

For a better understanding of the present invention together with other and further objects, advantages and capabilities thereof, reference is made to the following disclosure and appended claims in connection with the above described drawings.

Figure 1:
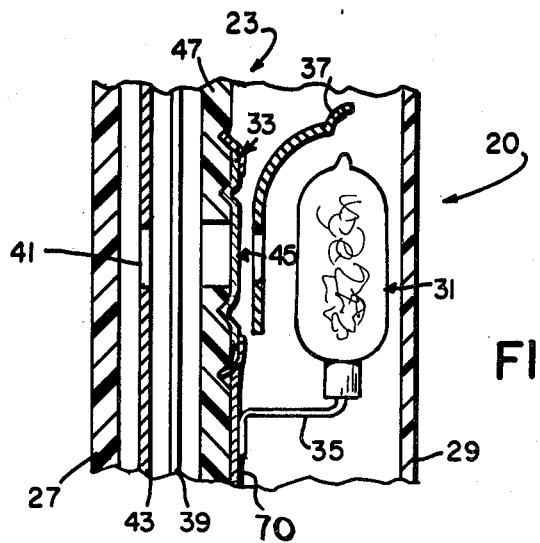
FIG. 1 is a partial elevational view, in section, of a photoflash device incorporating therein a circuit board assembly in accordance with a preferred embodiment of the invention.

With particular reference to FIG. 1, there is illustrated a partial, elevational view of an electrically-activated photoflash device 20 incorporating a circuit board assembly 23 in accordance with the unique principles of the instant invention. Device 20, like many of the photoflash devices described above, includes a plastic housing with rear and forward members 27 and 29, respctively. These two members may be secured together, e.g., using cement, or it is also possible to produce the entire housing from a single member of such material. Forward member 29 is light-transmitting to permit light emitted from each of the several flashlamps 31 (only one shown) to pass therethrough upon lamp ignition. Ignition is achieved when the device's end connector tab or tabs (not shown) are inserted within the socket of the camera used therewith and the camera's shutter release button activated. A suitable firing pulse is produced by the camera's power source (e.g., piezoelectric element) and passed to the respective lamp 31 via the connection provided at the connector tab. This pulse travels up through the device's circuitry (runs) 33 which forms part of assembly 23. As shown in FIG. 1, the two conductive lead-in wires 35 (only one shown) of lamp 31 are connected to circuitry 33, said means of connection accomplished by such methods as soldering or crimping (e.g., using metal eyelets). Photoflash devices of this type also typically include a reflector 37 for promoting forward light output. Reflector 37 is preferably of aluminum-coated plastic and located immediately behind lamp 31. Device 10 may further include a sheet of flash-indicating material 39 (e.g., biaxially oriented polypropylene) which shrinks or melts when subjected to heat from lamp 31 (through a pair of aligned apertures with reflector 37 and the substrate or board component of assembly 23) to thereby change the color viewable through the openings 41 (one shown) provided in an indicia sheet 43 (also optional). A user of the device is thus provided with a ready means of ascertaining whether or not a particular lamp or group of lamps has been flashed. Understandably, rear member 27 of the device's housing is also light-transmitting to permit viewing in the manner defined. Sheet 43 may be of paper or thin cardboard.

As stated, photoflash devices containing the above components (excluding of course a circuit board assembly in accordance with the teachings of the invention) are known in the art with examples of such being described in detail, for example, in the aforementioned patents. As also stated, it is further known in the art to incorporate radiation sensitive switches as an important element of such devices. Reference is again directed to assignee's U.S. Pat. No. 4,017,728. These elements, represented generally as numeral 45 in FIG. 1, are also referred to in the art as radiant-energy-activated switches, quick-disconnect switches, etc., and typically comprise a length (strip) of electrically conductive, heat shrinkable polymeric material attached to the device's board member across a respective aperture 49 (see below). The switching being attached at its ends, the midportion thereof is thus spatially suspended to avoid physical contact with the heat-absorbing surfaces of the circuit board. This arrangement maximizes the speed with which shrinking and separation of the midportion occurs upon receipt of heat from adjacent lamp 31. As shown, lamp 31 and switch 45 are electrically connected in series to assure proper connection between the aforedescribed power source and remaining, unfired lamps which also form part of device 20. This mode of operation is fully described in many of the aforementioned patents and further detail is not believed necessary.

Switch 45 comprises a thin strip of plastic preferably fabricated from a mono- or biaxially oriented polyethylene, polypropylene, polystyrene, polyester, or nylon. The polymeric material itself may be rendered conductive by additives such as carbons or may be made surface conductive by deposition of a suitable conductive layer thereon. The performance of highly reflective materials, such as aluminized polypropylene, can be enhanced by applying a coating or spot (not shown) of dark, light-absorbing material (e.g., link) on the surface of the switch which faces lamp 31.

As understood from the foregoing, it is essential that the opposing ends of switch 45 not only be properly secured to the board or substrate member (47) constituting a key element of assembly 23 but also must be electrically connected to respective, designated portions of circuit runs 33. When using the aforementioned technique of silk-screening, this electrical connection was achieved by carrying the circuit pattern over the ends of the switch's strip. This procedure thus resulted in additional use of the expensive, silver-containing conductive material, yet another disadvantage added to the list cited above. In prior devices, switch 45 was secured to board 47 using an adhesive tape with pressure thereafter applied to hopefully provide securement. This procedure did not prove altogether satisfactory, however, in that the strip was occasionally removed from the board during subsequent processes to which this product was subjected.

In accordance with the teachings of the present invention, switching element 45 and the conductive members 33 which form part of the overall circuitry for the finished circuit board assembly 23 are securedly positioned on the assembly's dielectric substrate 47 using a die-stamping process. The unique, end result of this process is that the conductive members are secured and electrically connected to the conductive switch element, which is also positively secured, without severing the switching element. With particular reference to FIGS. 2-5, there are shown the various steps of producing assembly 23 in order to achieve this result.

Figure 2:
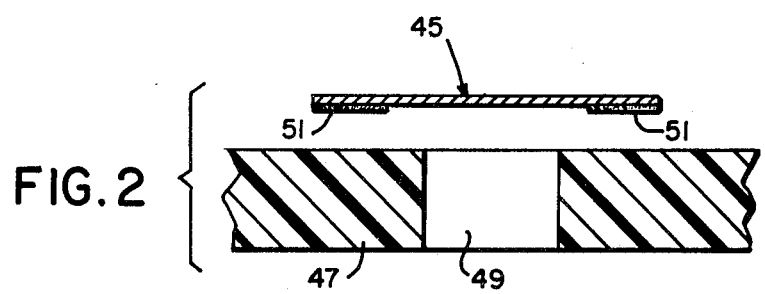
FIGS. 2-5 represent the steps of producing a circuit board assembly in accordance with the teachings of the invention.

In FIG. 2, switching element 45, preferably comprised of the polyester Mylar having a conductive (aluminum) layer thereon, is positioned above substrate 47 so as to align with an aperture 49 located within the substrate. The aluminum conductive layer (not shown) is understandably located along the upper surface of the Mylar. Aperture 49 in the finished product (device 20) permits radiant energy from flashlamp 31 to pass therethrough to the aforedescribed indicia sheet 43. Aperture 49 also serves to assure that a major portion of element 45 will not physically contact the upper surface of substrate 47. Such a surface, being heat-absorbing, could serve to reduce the operational effectiveness of element 45 during exposure thereof to the intense energy from flashlamp 31. Accordingly, element 45 is located on substrate 47 so as to bridge aperture 49 (FIG. 2). Initial attachment of element 45 is achieved by providing a quantity of adhesive 51 at both ends of the striplike element. Adhesive 51, preferably of the pressure-sensitive variety, may be applied using any of the techniques well known in the art. The element 45 and adhesive are located on substrate 47 and a suitable pressure (sufficient to activate adhesive 51 and form a bond between the substrate and element at these locations) is applied downwardly on the element's upper surface. A roller or similar member can be used as the pressure applicator.

Figure 4:
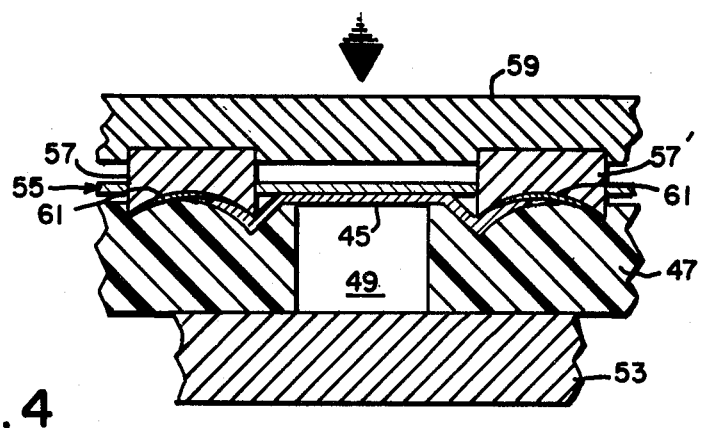
Figure 5:
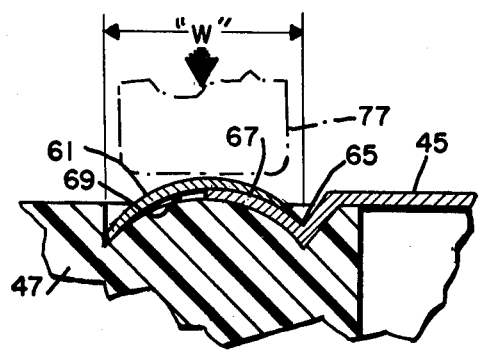

The combined substrate and element members are next positioned on a base or platen 53 which forms part of the larger die-stamping machine. Base 53 preferably includes a recessed portion or cavity (not shown) therein to better accomodate substrate 47, the substrate being positioned within said cavity. A thin strip of conductive material 55 is then oriented above the substrate 47 in the manner shown in FIG. 3, afterwhich it is lowered to substantially cover both substrate and switching element. Material 55 is dead soft aluminum, having a thickness of about 0.002 inch. Once in position, the aluminum strip is engaged by two dies 57 and 57' which each are secured or form part of an upper platen 59 of the machine. Platen 59 and dies 57 and 57' are preferably both comprised of steel (e.g., low carbon). The upper platen is lowered mechanically to effect said engagement with the positioned strip 55. Downward force is further applied by dies 57 and 57' until preselected portions 61 of strip 55 and switching element 45 are pressed an established distance into substrate 47 (FIG. 4). A total force within the range of about 250 to 350 pounds per linear inch of cutting edge (of dies 57, 57') is applied using the materials and thicknesses described herein. The dielectric substrate, having a preferred thickness of about 0.043 inch, is embedded a depth of about 0.004 inch at its deepest location (immediately below the outer cutting edges 63 of each die). As illustrated in FIG. 4, both ends of the striplike switching element 45 are thus positively secured within substrate 47 on opposing sides of aperture 49. Element 45, having an original thickness of about 0.0005 inch, possesses a hardness greater than both the dielectric substrate (comprised of high impact polystyrene) and aluminum strip and is thus not substantially deformed by the die-stamping procedure. This significant feature is the result of a proper selection of materials and thicknesses for the components of circuit board assembly. As further understood, the aluminum sheet also possesses a hardness greater than that presented by the dielectric substrate, at least during the initial stages of the stamping operation. As illustrated in FIG. 5, this selection of materials, thicknesses, and pressures (and, as will be described, temperatures) assures not only retention of the designated portion of switching element 45 within substrate 47 but also that the preselected, pressed portion 61 of aluminum strip 55 will also be securely retained and at the same time provide positive electrical contact with element 45. Contact is formed primarily at two locations, the first being at the extreme, substantially flattened edge 65 of the conductive member defined by portion 61, and the second along the common arcuate surface (boundary) 67 between portion 61 and element 45. As shown, the conductive member is also of substantially arcuate configuration with its extreme ends substantially tapered by the die-stamping procedure. This final configuration is due to the increased forces exerted along the outer, deeper penetrating parallel edges 63 of the die in comparison to forces exerted at its more recessed portions. The use of parallel cutting edges 63 understandably permits some parts of strip 55 to remain attached to portion(s) 61 after stamping, if desired. These parts, e.g., 70 in FIG. 1, are also die-stamped within substrate 47 by the apparatus defined herein and will constitute the remaining section of circuit 33. Parts 70 are not shown in FIGS. 4 and 5 for reasons of clarity. Thicknesses of strip 55 substantially equal to or greater than switch 45 were successfully employed. In all instances, the thicknesses of both the aluminum strip 55 and the switch 45 were substantially less than the dielectric 47. In final, stamped form, conductive member 61 has a width of (dimension "w") about 0.0625 inch. Only part of member 61 lies atop (or covers) the embedded portion of switch 45, but said part is deemed of sufficient size so as to achieve the purposes intended. The overlapping segment of conductive member 61 thus also serves to assist in retention of the embedded portion of switch 45. It is important to note that while edge 65 does achieve contact with switch 45, it does not deform or sever this element. Severance or even substantial deformation could render this portion of the circuitry inoperative. Much of the adhesive (51) which was originally applied to the bottoms of the ends of switch 45 pressed within substrate 47 will be forced out from under the switch during this operation but some (not shown) will remain to assist in retention. That adhesive material which is forced (or squeezed) out may settle within the recess 69 located under the non-covering portion of member 61. Thus, switch 45 provides a relief for this adhesive in the manner illustrated in FIG. 5.

Figure 3:
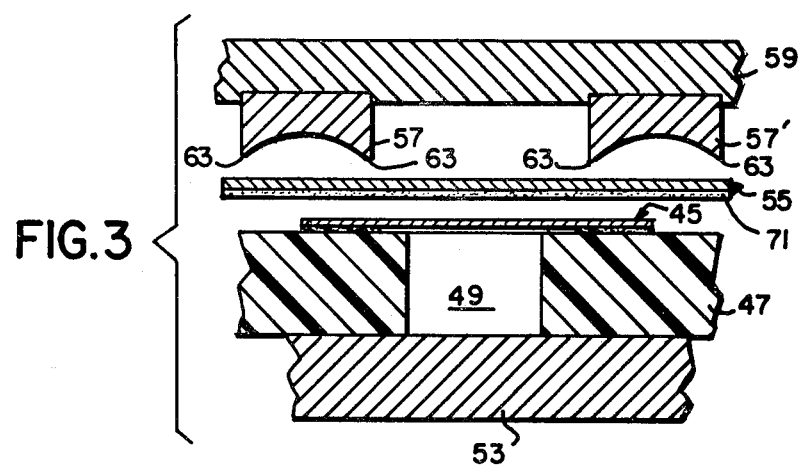

As also shown in FIG. 3, another adhesive (71) is applied to the bottom of aluminum strip 55. The preferred adhesive is of the heat sensitive variety (several of which are well known in the art) and preferably possesses a quick reaction time. It can be applied directly to the bottom of strip 55 during manufacture thereof or can be provided in separate, sheet form. The adhesive has a thickness of about 0.0007 inch, and is activated during the die-stamping process by heating each of the top dies 57 and 57'. Preferred temperatures were within the range of about 325 to 400 degrees Farenheit. The bottom or base member 53 was not heated. In the stamping operation, the adhesive 71 engaging the common surface 67 will be substantially squeezed out into recess 69, thus assuring the described positive contact along this surface. It was found, however, that even if adhesive was to remain at this location, adequate electrical contact was still attained. Subsequent to this aforedefined stamping procedure, the upper platen 59 is withdrawn (e.g., to the original elevation shown in FIG. 3) and the remaining, non-stamped part of aluminum strip 55 removed. Removal may be accomplished by hand or a suitable stripping tool (e.g., roller).

As an optional step, it may be desirable to engage predetermined (e.g., the uppermost) portions of the defined, stamped conductive member 61 with a heated die 77 (shown in phantom in FIG. 5) in the event that the heat sensitive adhesive located immediately under these portions was not fully exposed to the elevated temperatures of dies 57 and 57'. It is understood that this is but an optional step and may only be desired for portions of the circuit board assembly's circuitry which will be subjected to great stress (e.g., insertion forces encountered during positioning of the finished devices 20 within the socket of a respective camera). Die 77 would be heated to a temperature substantially the same for that of dies 57, 57', should this step be used.

EXAMPLE

Sixty high impact polystyrene substrates, each having a thickness of about 0.043 inch, were die-stamped in accordance with the teachings herein. Each substrate contained a total of eight Mylar switching elements (having a thickness of 0.0005 inch) spacedly positioned thereon in a desired pattern. A 0.002 inch thick dead soft aluminum sheet was placed over each and a heated (350 degrees Farenheit) steel die, having a dinking depth (depth of cutting edge) of 0.004 inch, was employed. A pressure of 300 pounds per linear foot of cutting edge was applied. None of the switching elements were severed by the die's cutting edges or the dead soft aluminum and all possessed a satisfactory electrical contact to the respective, pressed conductive members formed from the aluminum. By way of further example, all of said switches possessed a spark gap contact (to conductive member) of less than 500 volts. Approximately 99 percent of these had a spark gap contact of less than 200 volts. Both of these are deemed completely satisfactory for photoflash devices of the variety utilizing high voltage flashlamps.

Thus there has been shown and described a new and unique circuit board assembly for use in a photoflash device. In addition, there has been shown and described a new and unique method for making said assembly. It is understood from the foregoing description that the invention as described herein possesses all the significant advantages cited above.

While there have been shown and described what are at present considered and preferred embodiments of the invention, it will be obvious to those skilled in the art that various changes and modifications may be made therein without departing from the scope of the invention as defined by the appended claims.

What is claimed is:

1. A circuit board assembly for use within a photoflash device, said circuit board assembly comprising:
   a dielectric substrate;
   at least one thin, electrically conductive switching element having a portion thereof die-stamped an established distance within a surface of said substrate; and
   at least one thin, electrically conductive metallic member die-stamped within said surface of said substrate simultaneously with said switching element and having a part thereof located on said die-stamped portion of said switching element, said die-stamping electrically connecting said conductive member to said portion of said switching element and securedly positioning both said conductive member and said switching element on said dielectric substrate without severing said switching element.

2. The circuit board assembly according to claim 1 wherein said dielectric substrate includes at least one aperture therein, said switching element bridging said aperture.

3. The circuit board assembly according to claim 1 including a first quantity of adhesive material located between said part of said conductive member located on said portion of said switching element and said portion of said switching element.

4. The circuit board assembly according to claim 3 including a second quantity of adhesive material located between said portion of said switching element die-stamped within said dielectric substrate and said substrate.

5. The circuit board assembly according to claim 1 wherein said switching element possesses a greater hardness than said dielectric substrate and said conductive member.

6. The circuit board assembly according to claim 5 wherein said conductive member possesses a hardness greater than said dielectric substrate.

7. The circuit board assembly according to claim 5 wherein said dielectric substrate possesses a thickness greater than said switching element and said conductive member.

8. The circuit board assembly according to claim 7 wherein said conductive member possesses a thickness substantially equal to or greater than said switching element.

9. The circuit board assembly according to claim 5 wherein said switching element is comprised of a polymeric material.

10. The circuit board assembly according to claim 9 wherein said polymeric material is selected from the group consisting of mono- or biaxially oriented polyethylene, polypropylene, polystyrene, polyester, or nylon.

11. The circuit board assembly according to claim 10 wherein said conductive material is comprised of dead soft aluminum.

12. The circuit board assembly according to claim 11 wherein the material of said dielectric substrate is high impact polystyrene.

13. The circuit board assembly according to claim 1 wherein said switching element and said conductive member are electrically connected at two locations by said die-stamping, a first of said locations being along an edge of said conductive member and a second of said locations being along a common boundary between said switching element and said conductive member.

14. The circuit board assembly according to claim 1 wherein said part of said conductive member positioned on said die-stamped portion of said switching element serves to assist in retaining said switching element on said dielectric substrate.

15. The circuit board assembly according to claim 1 wherein said die-stamped portion of said switching element and said part of said conductive member die-stamped within said dielectric substrate are each of a substantially arcuate configuration, the ends of said conductive member being substantially tapered.

* * * * *